United States Patent [19]
Bollero et al.

[11] 4,365,193
[45] Dec. 21, 1982

[54] OVERVOLTAGE-PULSE ANALYZER

[75] Inventors: Adriano Bollero, Rivarolo Canavese; Bruno Carpinello, Turin; Giuseppe Galliano, Turin; Roberto Pomponi, Turin, all of Italy

[73] Assignee: Cselt - Centro Studi e Laboratori Telecomunicazioni S.p.A., Turin, Italy

[21] Appl. No.: 174,695

[22] Filed: Aug. 1, 1980

[30] Foreign Application Priority Data

Aug. 2, 1979 [IT] Italy .................. 68599 A/79

[51] Int. Cl.³ .................. G01R 29/00; G01R 19/16
[52] U.S. Cl. .................. 324/102; 324/77 A; 324/103 P
[58] Field of Search .................. 324/102, 103 R, 103 P, 324/133, 111, 77 A; 307/351; 340/662

[56] References Cited

U.S. PATENT DOCUMENTS 2,752,589  6/1956  De Long, Jr. .................. 324/103 R
2,884,085  4/1959  Von Wittern et al. .................. 324/103 R Primary Examiner—Ernest F. Karlsen
Attorney, Agent, or Firm—Karl F. Ross

[57] ABSTRACT

A system for measuring and storing the amplitudes plus duration and/or rise times of overvoltage pulses occurring on a transmission line comprises a voltage divider working into a first and a second comparator respectively detecting an abnormal voltage exceeding a predetermined sensitivity threshold and discriminating among different amplitude levels above that threshold. The first comparator triggers an oscillator driving a pulse counter which measures the duration of an overvoltage pulse and also provides quantized information on rise time to the highest amplitude threshold surpassed by that pulse as determined by the second comparator. This information is stored in a memory with two groups of cells respectively assigned to combinations of amplitude with duration and combinations of amplitude with rise time, the occurrence of any such combination incrementing the contents of the respective cell. These cells are cyclically scannable and their contents can be selectively displayed on a visualizer such as an oscilloscope.

7 Claims, 1 Drawing Figure

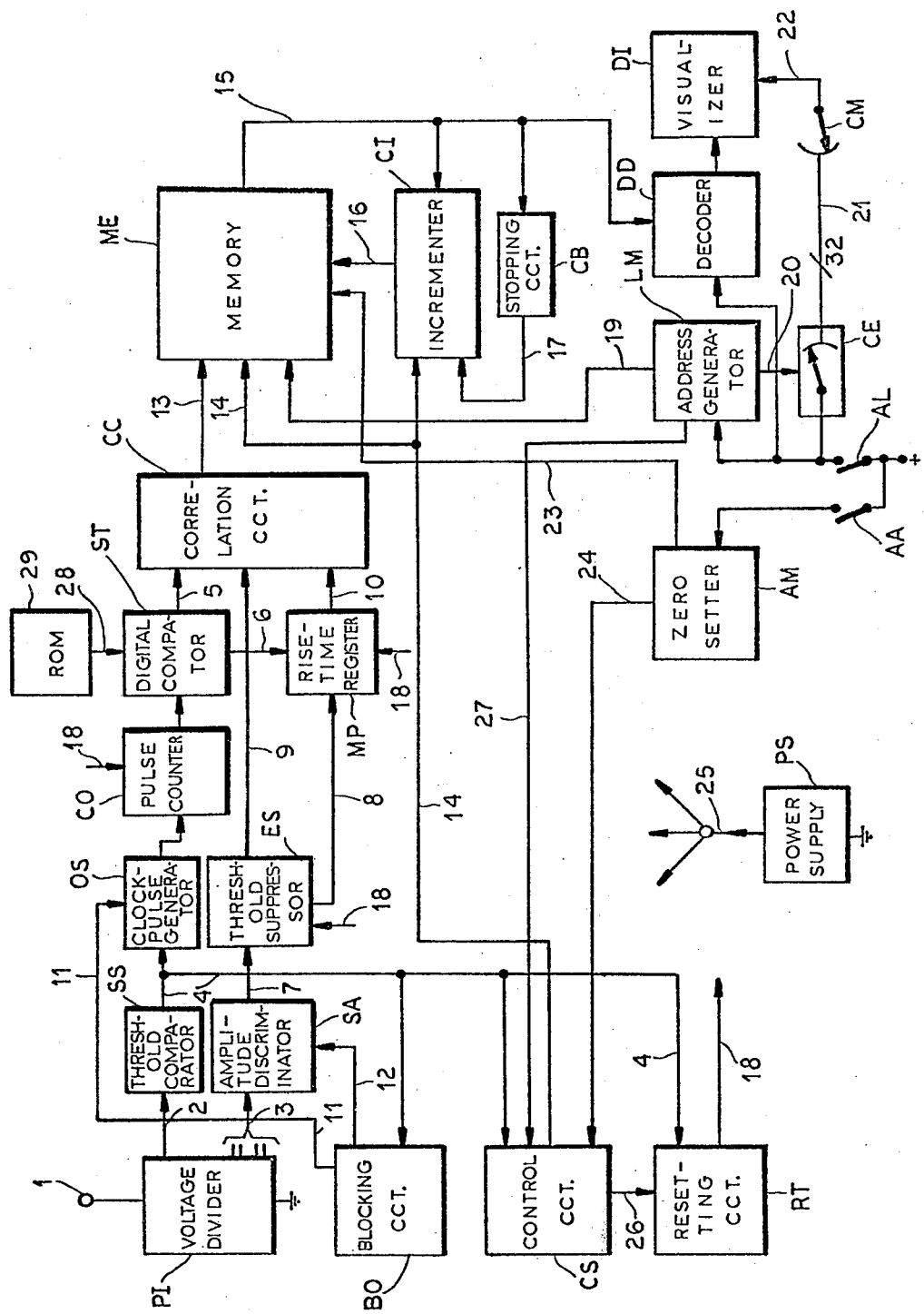

OVERVOLTAGE-PULSE ANALYZER

FIELD OF THE INVENTION

Our present invention relates to a system for measuring and storing the characteristics of abnormally high voltages (referred to hereinafter as overvoltage pulses) temporarily appearing on a transmission line, especially a combination of criteria such as the peak amplitude of a voltage pulse of abnormally high absolute magnitude plus the overall duration and/or rise time of such a pulse.

BACKGROUND OF THE INVENTION

The overvoltages here considered may be transients due, for example, to strokes of lightning or interference from nearby electrical components. A knowledge of their waveform, i.e. of the aforementioned criteria, is important for the installation of protective devices on such transmission lines and associated equipment.

The conventional way of analyzing the characteristics of overvoltage pulses involves their recordal on a tape or photographic film, or their visualization by an oscilloscope provided with pulse-storing circuitry. Recording or display devices used for this purpose are relatively expensive and require a practically noise-free power supply.

OBJECT OF THE INVENTION

The object of our present invention, therefore, is to provide a simplified system for detecting one or more of the aforementioned criteria of overvoltage pulses and making this information readily available, preferably by a visual display, for evaluation.

SUMMARY OF THE INVENTION

In accordance with the present invention, we provide voltage-sensing means coupled to a transmission line to be monitored for detecting overvoltage pulses of absolute magnitude exceeding a predetermined sensitivity threshold and for distinguishing among a plurality of different amplitude levels above that threshold, these amplitude levels constituting a first set of criteria. We further provide timing means controlled by the voltage-sensing means for measuring an interval lasting from the instant of detection of such an overvoltage pulse to at least the instant of attainment of the highest amplitude level reached by that pulse, but not beyond the instant of its disappearance, and for classifying the intervals so measured in a plurality of time periods constituting a second set of criteria. Thus, the latter criteria may represent either the rise time or the overall duration of the detected overvoltage pulse. A memory having a multiplicity of cells respectively assigned to different combinations of these first and second criteria has input connections to the voltage-sensing means and to the timing means for addressing the assigned cell upon the disappearance of the detected overvoltage pulse. A progressively increasing numerical value is stored with the aid of an incrementer in the memory cell so addressed, that value representing the number of detected overvoltage pulses exhibiting the corresponding combination of criteria. The contents of any cell can be read out by indicator means connectable thereto and can be erased by clearing means connected to the memory.

Pursuant to a more particular feature of our invention, the voltage-sensing means may comprise first comparison means for generating an enabling signal in the presence of an overvoltage pulse exceeding the aforementioned sensitivity threshold and second comparison means for emitting a discriminating signal indicative of the highest amplitude level attained by that pulse. The timing means may comprise a clock-pulse counter which is periodically stepped in the presence of the enabling signal and third comparison means for generating a quantized duration signal by comparing the setting of this counter with the aforementioned different time periods, the input connections of the memory including correlation means connected to receive the quantized duration signal and the discriminating signal from the respective comparison means.

When the rise time is of interest instead of or in addition to the overall pulse duration, the timing means may further include a register controlled by the second and third comparison means for temporarily storing the time period coinciding with the highest attained amplitude level and for emitting the time period thus stored to the correlation means as a quantized rise-time signal upon termination of the enabling signal. Advantageously, the memory cells are divided into two groups respectively assigned to combinations of amplitude level with quantized duration and with quantized rise time.

In a system distinguishing among m amplitude levels and n time periods, the memory will have two groups of m.n cells each for storing all possible combinations of amplitude level with overall duration and amplitude level with rise time. In the embodiment more particularly described hereinafter, $m=n=4$ so that the number of cells will be 32.

BRIEF DESCRIPTION OF THE DRAWING

The above and other features of our invention will now be described in detail with reference to the accompanying drawing the sole FIGURE of which is a block diagram of a representative embodiment.

SPECIFIC DESCRIPTION

In the drawing we have shown an input terminal 1 to which voltage pulses from a transmission line to be monitored are fed, preferably with galvanic isolation through a decoupling capacitor or a photo-optical coupler. A voltage divider PI, inserted between terminal 1 and ground, has a tap connected via a lead 2 to a threshold comparator SS and four other taps connected via a multiple 3 to as many other comparators (not shown) in an amplitude discriminator SA; components SS and SA together constitute the voltage-sensing means referred to above. An output lead 4 of comparator SS, energized whenever the voltage on terminal 1 exceeds a predetermined minimum limit, extends to an enabling input of a square-wave oscillator OS serving as a generator of clock pulses connected to a stepping input of a pulse counter CO. This counter works into a digital comparator ST also receiving, via a multiple 28, four numerical values representing respective time periods or temporal thresholds stored in a read-only memory 29. An output lead 7 of amplitude discriminator SA carries a signal identifying the highest-ranking comparator thereof whose threshold is surpassed by the stepped-down input voltage received via multiple 3. Lead 7 extends to a threshold suppressor ES comprising a register which stores only the identity of the highest-ranking comparator thus activated in discriminator SA, this information representing the highest quantized amplitude level which has been attained at any given moment by the voltage pulse present on input terminal 1. It will be understood that the lowest amplitude level recognized by the discriminator may be chosen as close as desired to the sensitivity threshold of comparator SS and may even be identical therewith.

Threshold suppressor ES, which at any time stores only the highest amplitude level read out up to such time from discriminator SA, has two output leads 8 and 9 respectively delivering the stored information to a rise-time register MP and to a correlation circuit CC; the latter has two further input leads 5 and 10 originating at comparator ST and register MP, respectively. Upon the termination of the voltage pulse sensed by components SS and SA, the disappearance of the enabling signal on lead 4 triggers a blocking circuit BO and a control circuit CS while also activating a normally inoperative resetting circuit RT. By energizing an output lead 11, blocking circuit BO stops the oscillator OS, thereby also arresting the pulse counter CO; on another output lead 12 it disables the amplitude discriminator SA. Component ST compares the digital reading of counter CO with the several temporal thresholds received from memory 29 and emits on lead 5 a quantized duration signal to correlation circuit CC. It will be understood that these temporal thresholds, as well as the amplitude thresholds established by discriminator SA, need not be uniformly spaced but may conform, for example, to a geometric progression.

Component MP, which essentially consists of a shift register, receives from comparator ST via a lead 6 the quantized time information available on lead 5 and stores that information as of the instant when the signal on lead 8 changes as a result of a rise of the input voltage on terminal 1 above a new threshold of discriminator SA. Since threshold suppressor ES does not respond to a decrease in pulse amplitude, the information appearing on the output lead 10 of register MP represents the quantized time of arrival of the detected input voltage at its quantized peak. The rise-time signal on lead 10 is not affected by further advances of counter CO after the peak has been reached and the voltage pulse has begun to decay.

On the basis of the duration signal on lead 5, the discriminating signal on lead 9 and the rise-time signal on lead 10, each of which may assume any of four different values, correlation circuit CC addresses—via a connection 13—two cells of a memory ME having 32 such cells divided into two groups of 16 cells each. A cell of the first group is selected under the control of data words present on leads 5 and 9, i.e. in accordance with the quantized amplitude and duration of the detected voltage pulse, whereas a cell of the second group is chosen under the control of data words present on leads 9 and 10, i.e. on the basis of quantized amplitude and rise time. The selection is enabled by a signal on an output lead 14 of control circuit CS activated when the voltage on terminal 1 drops below the sensitivity threshold established by comparator SS. Lead 14 also extends to an incrementer CI which receives the numerical contents of each addressed cell over a connection 15 and, via a connection 16, augments these contents by one unit.

The readout connection 15 of memory ME further extends to a stopping circuit CB and to a decoder DD. Circuit CB compares the contents of each addressed cell with an upper numerical limit, e.g. 99 or 999, and disables the incrementer CI via a lead 17 when that limit is reached. This feature makes it possible to choose a storage capacity for the memory cells consistent with a maximum number of expected occurrences of overvoltage pulses within a given monitoring period.

The signal emitted by control circuit CS on lead 14 may consist of two parts, the first allowing the contents of the addressed cells to be read and the second allowing their incremented values to be written therein. Thereafter, the control circuit energizes an output lead 26 commanding the resetting circuit RT, already enabled by the termination signal on lead 4, to energize an output lead 18 which extends to zeroizing inputs of pulse counter CO, threshold suppressor ES and rise-time register MP. The next voltage pulse appearing on terminal 1, therefore, finds these circuits again in their starting condition.

All the cells of memory ME can be concurrently cleared by a connection 23 from a zero setter AM which is manually triggerable by a switch AA and has another output lead 24 extending to control circuit CS so as to cause the appearance of a writing command on lead 14. After such a zero-setting operation, therefore, the appearance of the first overvoltage pulse on terminal 1 will result in the writing of numerical value "1" in the two cells corresponding to the amplitude and timing criteria of that pulse. If a similar pulse occurs thereafter, the contents of these two cells will be incremented to the numerical value "2", and so on. At any time, therefore, memory ME contains information on the number of times a pulse of given characteristics has occurred since the last clearing.

Closure of a manual switch AL activates an address generator LM together with the aforementioned decoder DD. Generator LM, via an output multiple 19, cyclically scans all the cells of memory ME at a high rate of, say, several thousand cycles per second. Control circuit CS is turned on via a lead 27 to emit the necessary reading commands on lead 14. Decoder DD then translates the output signals on connection 15 into beam-deflecting signals for an oscilloscope DI whose beam, however, is normally suppressed. Switch AL is further connected to a multiplexer CE controlled by an output lead 20 of address generator LM for successive energization of 32 leads of a multiple 21 extending to a manual selector CM. Depending upon the position of that selector, a lead 22 is energized once per cycle to turn on the beam of oscilloscope DI at an instant when the contents of a chosen memory cell are being read out. Oscilloscope DI, therefore, visually displays on its screen the numerical value stored in the respective cell, representing the number of occurrences of overvoltage pulses having a particular combination of criteria. Thanks to retinal persistence and the high rate of scan, the luminous spot projected by the intermittently unblocked beam is perceived without a flicker. The cell thus selected may be in either one of the two aforementioned groups; if simultaneous display of the contents of cells from both groups were desired, the visualizer DI and the associated selector CM would have to be duplicated.

The drawing also shows an autonomous power supply PS, such as a primary or rechargeable battery, energizing the various active components of the system via connections 25.

We claim:

1. A system for measuring the characteristics of overvoltage pulses on a transmission line, comprising:

voltage-sensing means coupled to said transmission line for detecting overvoltage pulses of absolute magnitude exceeding a predetermined sensitivity threshold and for distinguishing among a specified number m of discrete amplitude levels above said threshold;

timing means controlled by said voltage-sensing means for measuring an interval lasting from the instant of detection of an overvoltage pulse to at least the instant of attainment of the highest amplitude level reached thereby but not beyond the instant of disappearance of said overvoltage pulse, the intervals so measured being classified in a plurality of time periods represented by a specified number n of quantized duration signals;

memory means provided with m times n cells respectively assigned to different combinations of amplitude levels and quantized duration, said memory means having input connections to said voltage-sensing means and said timing means for addressing the assigned cell upon the disappearance of the detected overvoltage pulse;

incrementing means connected to said memory means for storing a progressively increasing numerical value in a cell so addressed, said numerical value representing the number of detected overvoltage pulses exhibiting the corresponding combination of amplitude levels and quantized duration;

indicator means connectable to any of said cells for reading out the contents thereof; and clearing means connected to said memory means operable to erase the contents of all said cells.

2. A system as defined in claim 1 wherein said voltage-sensing means comprises first comparison means for generating an enabling signal in the presence of an overvoltage pulse exceeding said threshold and second comparison means for emitting a discriminating signal indicative of the highest amplitude level attained by said overvoltage pulse, said timing means comprising a clock-pulse counter periodically stepped in the presence of said enabling signal and third comparison means for generating a quantized duration signal by comparing the setting of said counter with said different time periods, said input connections including correlation means connected to receive said discriminating signal and said quantized duration signal from said second and third comparison means.

3. A system as defined in claim 2 wherein said timing means further includes a register controlled by said second and third comparison means for temporarily storing the time period coinciding with the highest attained amplitude level and for emitting the stored time period to said correlation means as a quantized rise-time signal upon termination of said enabling signal, said memory means including an additional group of m times n cells respectively assigned to combinations of amplitude level with quantized rise time.

4. A system as defined in claim 1, 2 or 3 wherein said memory means is provided with stopping means for arresting said incrementing means upon the contents of an addressed cell reaching a predetermined maximum numerical value.

5. A system as defined in claim 1, 2 or 3 wherein said indicator means comprises an address generator operable to scan all said cells in cyclic succession, display means for visualizing the contents of any scanned cell, and selector means settable to activate said display means only upon the appearance of a chosen cell address during each scanning cycle.

6. A system as defined in claim 2 or 3 wherein said voltage-sensing means further comprises a voltage divider having one tap connected to an input of said first comparison means and having a plurality of other taps connected to inputs of respective threshold comparators forming part of said second comparison means.

7. A system as defined in claim 1, 2 or 3, further comprising an autonomous power supply for energizing said voltage-sensing, timing, memory, incrementing, indicator and clearing means.

* * * * *